(12) United States Patent
Nakagawa et al.

(10) Patent No.: US 12,211,954 B2
(45) Date of Patent: Jan. 28, 2025

(54) LIGHT EMITTING APPARATUS AND PROJECTOR

(71) Applicants: SEIKO EPSON CORPORATION, Tokyo (JP); SOPHIA SCHOOL CORPORATION, Tokyo (JP)

(72) Inventors: Yohei Nakagawa, Tokyo-to (JP); Katsumi Kishino, Akiruno (JP)

(73) Assignees: SEIKO EPSON CORPORATION, Tokyo (JP); SOPHIA SCHOOL CORPORATION, Tokyo (JP)

( * ) Notice: Subject to any disclaimer, the term of this patent is extended or adjusted under 35 U.S.C. 154(b) by 392 days.

(21) Appl. No.: 17/575,565

(22) Filed: Jan. 13, 2022

(65) Prior Publication Data
US 2022/0231194 A1    Jul. 21, 2022

(30) Foreign Application Priority Data

Jan. 15, 2021  (JP) ................................. 2021-004794

(51) Int. Cl.
*H01L 33/32*  (2010.01)
*G03B 21/20*  (2006.01)

(52) U.S. Cl.
CPC .......... *H01L 33/32* (2013.01); *G03B 21/2033* (2013.01)

(58) Field of Classification Search
CPC ....... H01L 33/32; H01L 33/14; H01L 33/025; H01L 33/007; H01L 33/06; H01L 33/20; H01L 33/18; H01L 33/08; G03B 21/2033; H01S 5/11; H01S 5/187; H01S 5/341; H01S 5/04253; H01S 5/04257; H01S 5/34333; H01S 5/2013; H01S 5/3216

See application file for complete search history.

(56) References Cited

U.S. PATENT DOCUMENTS

| | | | |
|---|---|---|---|
| 6,057,560 A | 5/2000 | Uchida | |
| 10,403,787 B2 | 9/2019 | Zhang et al. | |
| 11,444,222 B2* | 9/2022 | Furusawa | H01S 5/2206 |
| 11,456,439 B2* | 9/2022 | Ko | H10K 50/844 |
| 11,515,688 B2* | 11/2022 | Fimland | H01S 5/34333 |

(Continued)

FOREIGN PATENT DOCUMENTS

| | | |
|---|---|---|
| JP | H10173294 | 6/1998 |
| JP | 2009076896 | 4/2009 |

(Continued)

*Primary Examiner* — Kyoung Lee
*Assistant Examiner* — Sophia W Kao
(74) *Attorney, Agent, or Firm* — JCIPRNET

(57) ABSTRACT

A light emitting apparatus includes a laminated structure including a plurality of columnar portions. The plurality of columnar portions each includes a first semiconductor layer, a second semiconductor layer different from the first semiconductor layer in terms of conductivity type, and a light emitting layer provided between the first semiconductor layer and the second semiconductor layer. The second semiconductor layer has a first section, and a second section that surrounds the first section in a plan view along a lamination direction in which the first semiconductor layer and the light emitting layer are laminated structured on each other and has a bandgap wider than a bandgap of the first section. The second section forms a side surface of each of the columnar portions.

6 Claims, 6 Drawing Sheets

(56) References Cited

U.S. PATENT DOCUMENTS

| | | | |
|---|---|---|---|
| 2016/0027961 A1* | 1/2016 | Mi | H01L 33/18 |
| | | | 257/13 |
| 2016/0099379 A1 | 4/2016 | Svensson et al. | |
| 2018/0351037 A1 | 12/2018 | Zhang et al. | |
| 2020/0036163 A1* | 1/2020 | Nishioka | H01S 5/11 |
| 2023/0395746 A1* | 12/2023 | Mi | H01L 33/24 |
| 2023/0402569 A1* | 12/2023 | Choi | H01L 33/145 |

FOREIGN PATENT DOCUMENTS

| | | | | |
|---|---|---|---|---|
| JP | 2009152474 | | 7/2009 | |
| JP | 2017147963 A | * | 8/2017 | A01C 7/08 |
| JP | 2018137439 | | 8/2018 | |
| JP | 2019502257 | | 1/2019 | |
| JP | 2019029522 A | * | 2/2019 | |
| JP | 7232464 B2 | * | 3/2023 | G03B 21/2033 |

* cited by examiner

LIGHT EMITTING APPARATUS AND PROJECTOR

The present application is based on, and claims priority from JP Application Serial Number 2021-004794, filed Jan. 15, 2021, the disclosure of which is hereby incorporated by reference herein in its entirety.

BACKGROUND

1. Technical Field

The present disclosure relates to a light emitting apparatus and a projector.

2. Related Art

Semiconductor lasers are expected as a high-luminance, next-generation light source. Among the semiconductor lasers, semiconductor lasers using nanocolumns are expected to achieve high power light emission at small radiation angles based on the photonic crystal effect provided by the nanocolumns.

For example, JP-A-2009-152474 describes a compound semiconductor light emitting device including a plurality of GaN nanocolumns formed by sequentially laminating an n-type GaN layer, a light emitting layer, and a p-type GaN layer on each other.

Due to the presence of dangling bonds on the side surfaces of the nanocolumns described above, carrier recombination in the vicinity of the side surfaces of the nanocolumns is likely to be non-light-emission recombination.

SUMMARY

A light emitting apparatus according to an aspect of the present disclosure includes a laminated structure including a plurality of columnar portions. The plurality of columnar portions each includes a first semiconductor layer, a second semiconductor layer different from the first semiconductor layer in terms of conductivity type, and a light emitting layer provided between the first semiconductor layer and the second semiconductor layer. The second semiconductor layer has a first section, and a second section that surrounds the first section in a plan view along a lamination direction in which the first semiconductor layer and the light emitting layer are laminated structured on each other and has a bandgap wider than a bandgap of the first section. The second section forms a side surface of each of the columnar portions.

A projector according to another aspect of the present disclosure includes the light emitting apparatus according to the aspect of the present disclosure.

DESCRIPTION OF EXEMPLARY EMBODIMENTS

A preferable embodiment of the present disclosure will be described below in detail with reference to the drawings. It is not intended that the embodiment described below unduly limits the contents of the present disclosure described in the claims. Further, all configurations described below are not necessarily essential configuration requirements of the present disclosure.

1. Light Emitting Apparatus

1.1. Overall Configuration

Figure 1:
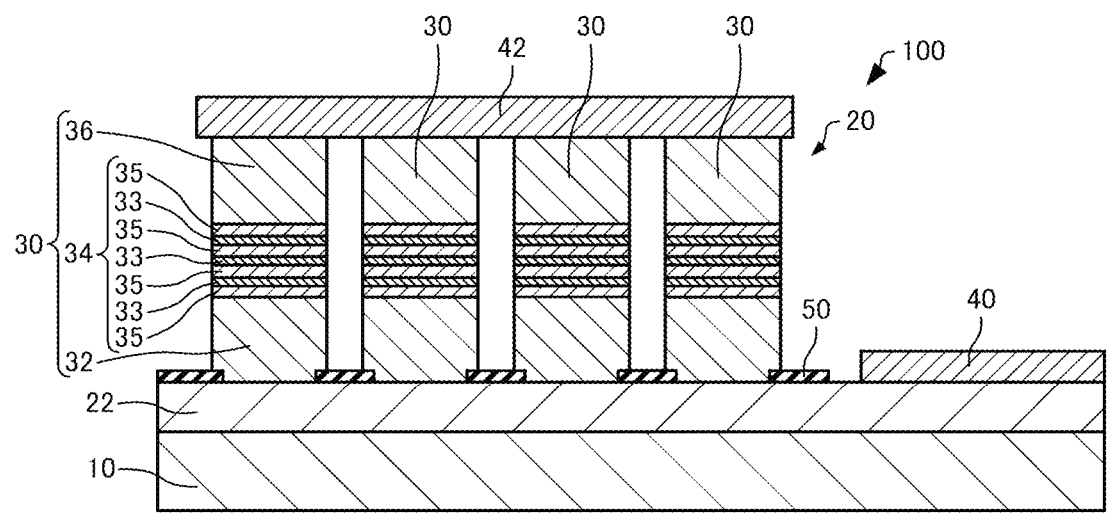
FIG. 1 is a cross-sectional view diagrammatically showing a light emitting apparatus according to an embodiment of the present disclosure.

A light emitting apparatus according to the present embodiment will first be described with reference to the drawings. FIG. 1 is a cross-sectional view diagrammatically showing a light emitting apparatus 100 according to the present embodiment.

The light emitting apparatus 100 includes, for example, a substrate 10, a laminated structure 20, a first electrode 40, and a second electrode 42, as shown in FIG. 1. The light emitting apparatus 100 is, for example, a semiconductor laser.

The substrate 10 is, for example, an Si substrate, a GaN substrate, a sapphire substrate, or an SiC substrate.

The laminated structure 20 is provided at the substrate 10. In the illustrated example, the laminated structure 20 is provided on the substrate 10. The laminated structure 20 includes, for example, a buffer layer 22 and columnar portions 30.

The present specification will be described on the assumption that in a lamination direction of the laminated structure 20 (hereinafter also simply referred to as "lamination direction"), the direction from a light emitting layer 34 as a reference toward the second electrode 42 is called an "upward direction" and the direction from the light emitting layer 34 as the reference toward the substrate 10 is called a "downward direction". The directions perpendicular to the lamination direction are also called an "in-plane direction". The "lamination direction of the laminated structure 20" refers to the direction in which a first semiconductor layer 32 and the light emitting layer 34 of each of the columnar portions 30 are laminated structured on each other.

The buffer layer 22 is provided on the substrate 10. The buffer layer 22 is, for example, an n-type GaN layer having been doped with Si. A mask layer 50 for forming the columnar portions 30 is provided on the buffer layer 22. The mask layer 50 is, for example, a silicon oxide layer, a titanium layer, a titanium oxide layer, or an aluminum oxide layer.

The columnar portions 30 are provided on the buffer layer 22. The columnar portions 30 each have a columnar shape protruding upward beyond the buffer layer 22. In other words, the columnar portions 30 protrude upward from the substrate 10 through the buffer layer 22. The columnar portions 30 are also called, for example, nanocolumns, nanowires, nanorods, and nanopillars. The columnar portions 30 each have, for example, a regular hexagonal planar shape or any other polygonal planar shape or a circular planar shape.

The columnar portions 30 each have a diameter, for example, greater than or equal to 50 nm but smaller than or equal to 500 nm. When the diameter of each of the columnar portions 30 is smaller than or equal to 500 nm, a high-quality-crystal light emitting layer 34 can be produced, and distortion intrinsically present in the light emitting layer 34 can be reduced. The light generated in the light emitting layer 34 can thus be efficiently amplified.

In a case where the columnar portions 30 each have a circular planar shape, the term "the diameter of the columnar portions" refers to the diameter of the circular shape, and when the columnar portions 30 each have a non-circular planar shape, the term refers to the diameter of a minimum circle containing the non-circular shape therein. For example, when the columnar portions 30 each have a polygonal planar shape, the diameter of the columnar portions 30 is the diameter of a minimum circle containing the polygonal shape therein, and when the columnar portions 30 each have an elliptical planar shape, the diameter of the columnar portions 30 is the diameter of a minimum circle containing the elliptical shape therein.

The columnar portions 30 are located at a plurality of locations. The distance between adjacent columnar portions 30 is, for example, greater than or equal to 1 nm but smaller than or equal to 500 nm. The plurality of columnar portions 30 are arranged in predetermined directions at predetermined pitches when viewed in the lamination direction. The plurality of columnar portions 30 are arranged, for example, in a triangular lattice. The plurality of columnar portions 30 are not necessarily arranged in a specific pattern and may be arranged in a square lattice. The plurality of columnar portions 30 can express the photonic crystal effect.

The "pitch of the columnar portions" is the distance between the centers of columnar portions 30 adjacent to each other in any of the predetermined direction. In the case where the columnar portions 30 each have a circular planar shape, the term "the center of each of the columnar portions" refers to the center of the circle, and when the columnar portions 30 each have a non-circular planar shape, the term refers to the center of the minimum circle containing the non-circular shape therein. For example, when the columnar portions 30 each have a polygonal planar shape, the center of each of the columnar portions 30 is the center of a minimum circle containing the polygonal shape therein, and when the columnar portions 30 each have an elliptical planar shape, the center of each of the columnar portions 30 is the center of a minimum circle containing the elliptical shape therein.

The columnar portions 30 each include the first semiconductor layer 32, the light emitting layer 34, and a second semiconductor layer 36.

The first semiconductor layer 32 is provided on the buffer layer 22. The first semiconductor layer 32 is provided between the substrate 10 and the light emitting layer 34. The first semiconductor layer 32 is, for example, an n-type semiconductor layer having been doped with Si.

The light emitting layer 34 is provided on the first semiconductor layers 32. The light emitting layer 34 is provided between the first semiconductor layer 32 and the second semiconductor layer 36. The light emitting layer 34 generates light when current is injected thereinto. The light emitting layer 34 includes, for example, well layers 33 and barrier layers 35. The well layers 33 and the barrier layers 35 are each an i-type semiconductor layer having been intentionally doped with no impurities. The light emitting layer 34 has a multiple quantum well (MQW) structure formed of the well layers 33 and the barrier layers 35. In the illustrated example, three well layers 33 and four barrier layers 35 are provided.

The numbers of well layers 33 and barrier layers 35, which form the light emitting layer 34, are not each limited to a specific number. For example, only one well layer 33 may be provided, and the light emitting layer 34, in this case, has a single quantum well (SQW) structure.

The second semiconductor layer 36 is provided on the light emitting layer 34. The second semiconductor layer 36 is a layer different from the first semiconductor layer 32 in terms of conductivity type. The second semiconductor layer 36 is, for example, a p-type semiconductor layer having been doped with Mg. The first semiconductor layer 32 and the second semiconductor layer 36 form a cladding layer having the function of confining the light in the light emitting layer 34.

Although not shown in the figures, an optical confinement layer (OCL) may be provided between the first semiconductor layer 32 and the light emitting layer 34. An electron blocking layer (EBL) may further be provided between the light emitting layer 34 and the second semiconductor layer 36.

In the light emitting apparatus 100, the p-type second semiconductor layers 36, the i-type light emitting layers 34, which have been doped with no impurities, and the n-type first semiconductor layers 32 form pin diodes. In the light emitting apparatus 100, when a forward bias voltage for the pin diodes is applied to the space between the first electrodes 40 and the second electrode 42, current is injected into the light emitting layers 34, whereby the electrons and holes recombine with each other in the light emitting layers 34. The recombination causes light emission. The light generated in the light emitting layers 34 propagates in the in-plane direction and forms a standing wave because of the photonic crystal effect provided by the plurality of columnar portions 30, and the standing wave receives gain in the light emitting layers 34 to undergo laser oscillation. The light emitting apparatus 100 then outputs positive first order diffracted light and negative first order diffracted light as laser light in the lamination direction.

Although not shown in the figures, a reflection layer may be provided between the substrate 10 and the buffer layer 22 or below the substrate 10. The reflection layer is, for example, a distributed Bragg reflector (DBR) layer. The reflection layer can reflect the light generated in the light emitting layers 34, and the light emitting apparatus 100 can emit the light only via the side facing the second electrode 42.

The first electrode 40 is provided on the buffer layer 22. The buffer layer 22 may be in ohmic contact with the first electrode 40. The first electrode 40 is electrically coupled to the first semiconductor layers 32. In the illustrated example, the first electrode 40 is electrically coupled to the first semiconductor layers 32 via the buffer layer 22. The first electrode 40 is one of the electrodes for injecting the current into the light emitting layers 34. The first electrode 40 is, for example, a laminated structure of a Cr layer, an Ni layer, and an Au layer laminated structured on each other in the presented order from the side facing the buffer layer 22.

The second electrode 42 is provided on the second semiconductor layers 36.

The second electrode 42 is electrically coupled to the second semiconductor layers 36. The second semiconductor layers 36 may be in ohmic contact with the second electrode 42. The second electrode 42 is the other one of the electrodes for injecting the current into the light emitting layers 34. The second electrode 42 is made, for example, of an indium tin oxide (ITO).

1.2. Detailed Configuration of Columnar Portion

Figure 2:
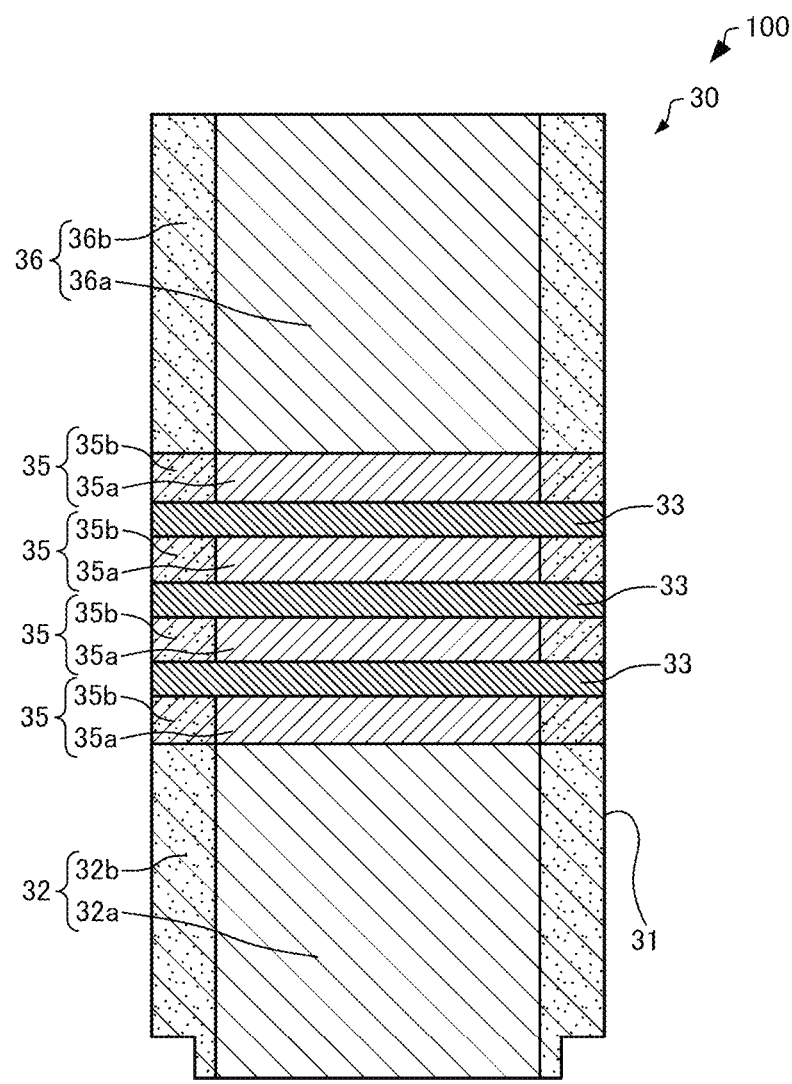
FIG. 2 is a cross-sectional view diagrammatically showing a columnar portion of the light emitting apparatus according to the embodiment.
Figure 3:
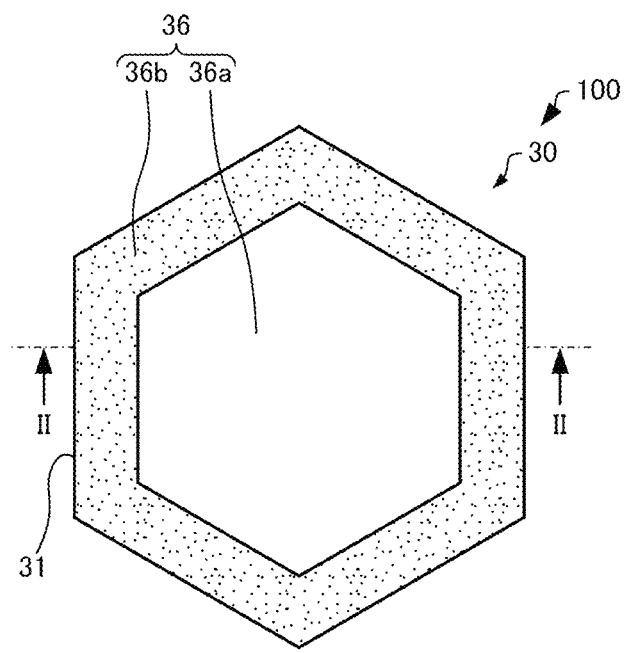
FIG. 3 is a plan view diagrammatically showing the columnar portion of the light emitting apparatus according to the embodiment.

FIG. 2 is a cross-sectional view diagrammatically showing one of the columnar portions 30. FIG. 3 is a plan view diagrammatically showing one of the columnar portions 30. FIG. 2 is a cross-sectional view taken along the line II-II in FIG. 3.

The first semiconductor layer 32 includes a low bandgap section 32a and a high bandgap section 32b, as shown in FIG. 2. The first semiconductor layer 32 is an AlGaN layer containing Al (aluminum), Ga (gallium), and N (nitrogen).

The bandgap of the high bandgap section 32b is wider than that of the low bandgap section 32a. The high bandgap section 32b surrounds the low bandgap section 32a in the plan view along the lamination direction (hereinafter also simply referred to as "in the plan view"). The high bandgap section 32b forms a side surface 31 of the columnar portion 30. The side surface 31 connects the upper surface of the buffer layer 22 to the lower surface of the second electrode 42. The angle of the side surface 31 with respect to the upper surface of the substrate 10 is greater than or equal to 60° but smaller than or equal to 90° and is, in the illustrated example, 90°. The atomic concentration (at %) of Al in the high bandgap section 32b is higher than that in the low bandgap section 32a.

The barrier layers 35 of the light emitting layer 34 each include a low bandgap section 35a and a high bandgap section 35b. The barrier layers 35 are each an AlGaN layer. The well layers 33 are, for example, each an InGaN layer.

The bandgap of the high bandgap section 35b is wider than that of the low bandgap section 35a. The high bandgap section 35b surrounds the low bandgap section 35a in the plan view. The high bandgap section 35b forms the side surface 31 of the columnar portion 30. The atomic concentration (at %) of Al in the high bandgap section 35b is higher than that in the low bandgap section 35a.

The second semiconductor layer 36 includes a low bandgap section 36a and a high bandgap section 36b. The second semiconductor layer 36 is an AlGaN layer.

The bandgap of the high bandgap section 36b is wider than that of the low bandgap section 36a. The high bandgap section 36b surrounds the low bandgap section 36a in the plan view, as shown in FIG. 3. In the illustrated example, the columnar portion 30 has a regular hexagonal planar shape. The high bandgap section 36b forms the side surface 31 of the columnar portion 30, as shown in FIGS. 2 and 3. The atomic concentration of Al in the high bandgap section 36b is higher than that in the low bandgap section 36a. In the columnar portion 30, Al is unevenly distributed or concentrated at the side surface 31.

The high bandgap sections 32b, 35b, and 36b are portions where the atomic concentration of Al is higher than that of Ga. In the high bandgap sections 32b, 35b, and 36b, the ratio of the atomic concentration of Al to the sum of the atomic concentrations of Al and Ga (hereinafter also referred to as "Al ratio") is greater than 0.5 and may be greater than or equal to 0.8. Furthermore, in the high bandgap sections 32b, 35b, and 36b, the Al ratio may be 1.0, in which case the high bandgap sections 32b, 35b, and 36b are made of AlN.

The low bandgap sections 32a, 35a, and 36a are portions where the atomic concentration of Al is lower than or equal to that of Ga. In the low bandgap sections 32a, 35a, and 36a, the Al ratio is lower than or equal to 0.5 and may be lower than or equal to 0.4.

The atomic concentrations of Al and Ga can be measured by scanning transmission electron microscope—energy dispersive X-ray spectroscopy (STEM-EDS).

1.3. Effects and Advantages

In the light emitting apparatus 100, the second semiconductor layers 36 each include the low bandgap section 36a as a first section and the high bandgap section 36b as a second section, which surrounds the low bandgap section 36a in the plan view and has a bandgap wider than that of the low bandgap section 36a, and the high bandgap section 36b forms the side surface 31 of each of the columnar portions 30. Therefore, in the light emitting apparatus 100, the current flowing at the side surface 31 of each of the columnar portions 30 can be reduced as compared, for example, with a case where the first and second sections have the same bandgap. The current resulting in non-light-emission recombination can thus be reduced. As a result, the current injection efficiency can be increased.

In the light emitting apparatus 100, the second semiconductor layers 36 are each an AlGaN layer, and the atomic concentration of Al in the high bandgap section 36b is higher than that in the low bandgap section 36a. Therefore, in the light emitting apparatus 100, the bandgap of the high bandgap section 36b can be readily made higher than that of the low bandgap section 36a by growing the second semiconductor layers 36 under the condition that Al is unevenly distributed or concentrated at the side surfaces 31 of the columnar portions 30.

In the light emitting apparatus 100, the first semiconductor layers 32 each include the low bandgap section 32a as a third section and the high bandgap section 32b as a fourth section, which surrounds the low bandgap section 32a in the plan view and has a bandgap wider than that of the low bandgap section 32a, and the high bandgap section 32b forms the side surface 31 of each of the columnar portions 30. Therefore, in the light emitting apparatus 100, the current flowing at the side surface 31 of each of the columnar portions 30 can be further reduced.

In the light emitting apparatus 100, the first semiconductor layers 32 are each an AlGaN layer, and the atomic concentration of Al in the high bandgap section 32b is higher than that in the low bandgap section 32a. Therefore, in the light emitting apparatus 100, the bandgap of the high bandgap section 32b can be readily made higher than that of the low bandgap section 32a by growing the first semiconductor layers 32 under the condition that Al is unevenly distributed or concentrated at the side surfaces 31 of the columnar portions 30.

In the light emitting apparatus 100, the light emitting layers 34 each include the well layers 33 and the barrier layers 35. The barrier layers 35 each include the low bandgap section 35a as a fifth section and the high bandgap section 35b as a sixth section, which surrounds the low bandgap section 35a in the plan view and has a bandgap wider than that of the low bandgap section 35a, and the high bandgap section 35b forms the side surface 31 of each of the columnar portions 30. Therefore, in the light emitting apparatus 100, the current flowing at the side surface 31 of each of the columnar portions 30 can be further reduced.

In the light emitting apparatus 100, the barrier layers 35 are each an AlGaN layer, and the atomic concentration of Al in the high bandgap section 35b is higher than that in the low bandgap section 35a. Therefore, in the light emitting apparatus 100, the bandgap of the high bandgap section 35b can be readily made higher than that of the low bandgap section 35a by growing the barrier layers 35 under the condition that Al is unevenly distributed or concentrated at the side surfaces 31 of the columnar portions 30.

The light emitting apparatus 100 is not limited to a laser and may instead be an LED (light emitting diode).

2. Method for Manufacturing Light Emitting Apparatus

Figure 4:
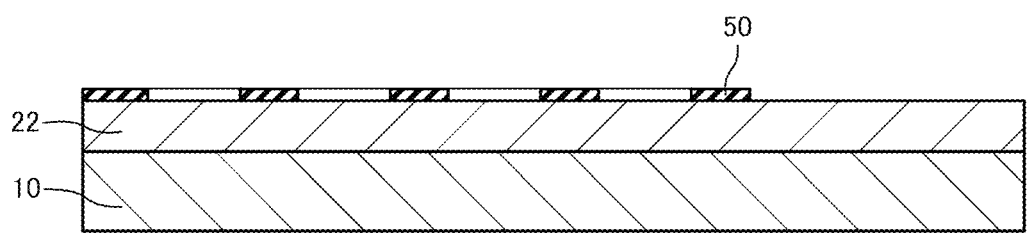
FIG. 4 is a cross-sectional view diagrammatically showing one of the steps of manufacturing the light emitting apparatus according to the embodiment.

A method for manufacturing the light emitting apparatus 100 according to the present embodiment will next be described with reference to the drawings. FIG. 4 is a cross-sectional view diagrammatically showing one of the steps of manufacturing the light emitting apparatus 100 according to the present embodiment.

The buffer layer 22 is epitaxially grown on the substrate 10, as shown in FIG. 4. Examples of the method for the epitaxial growth may include a metal organic chemical vapor deposition (MOCVD) method and a molecular beam epitaxy (MBE) method.

The mask layer 50 is then formed on the buffer layer 22. The mask layer 50 is formed, for example, by film formation using electron beam evaporation or sputtering, and patterning. The patterning is performed by photolithography and etching. The mask layer 50 has a thickness of, for example, about 5 nm.

The mask layer 50 is used as a mask to epitaxially grow the first semiconductor layers 32, the light emitting layers 34, and the second semiconductor layers 36 in the presented order on the buffer layer 22, as shown in FIG. 1. Examples of the method for the epitaxial growth may include the MOCVD method and the MBE method. A plurality of columnar portions 30 can be formed by carrying out the steps described above.

The epitaxial growth of the first semiconductor layers 32, the barrier layers 35, and the second semiconductor layers 36 is performed under the condition that Al is unevenly distributed or concentrated at the side surfaces 31 of the columnar portions 30. Specifically, the first semiconductor layers 32, the barrier layers 35, and the second semiconductor layers 36 are epitaxially grown at a growth temperature higher than or equal to 830° C. but lower than or equal to 870° C., preferably at 850° C. Al can thus be unevenly distributed or concentrated at the side surfaces 31 of the columnar portions 30.

Thereafter, the first electrode 40 is formed on the buffer layer 22, and the second electrode 42 is formed on the second semiconductor layers 36. The first electrode 40 and the second electrode 42 are formed, for example, by a vacuum evaporation method. The first electrode 40 and the second electrode 42 are not necessarily formed in a specific order.

The light emitting apparatus 100 can be manufactured by carrying out the steps described above.

3. Variations of Light Emitting Apparatus

3.1. First Variation

Figure 5:
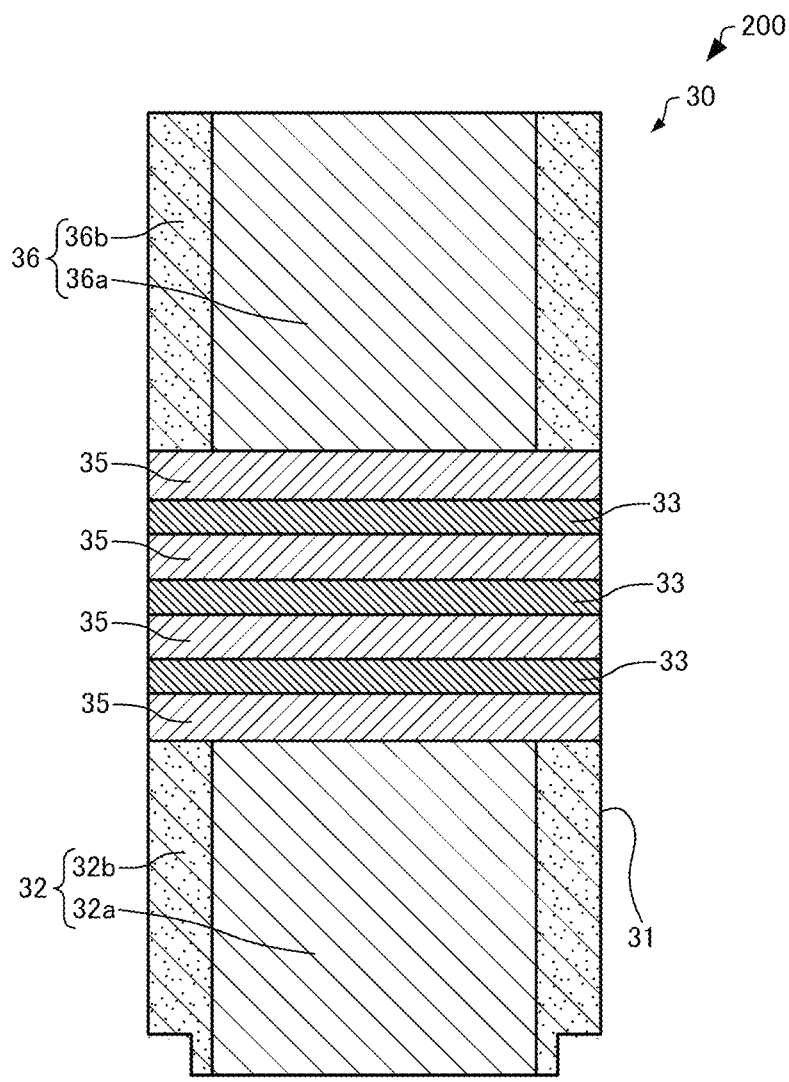
FIG. 5 is a cross-sectional view diagrammatically showing a columnar portion of the light emitting apparatus according to a first variation of the embodiment.

The light emitting apparatus according to a first variation of the present embodiment will next be described with reference to the drawings. FIG. 5 is a cross-sectional view diagrammatically showing one of the columnar portions 30 of a light emitting apparatus 200 according to the first variation of the present embodiment.

In the following description of the light emitting apparatus 200 according to the first variation of the present embodiment, a member having the same function as that of a constituent member of the light emitting apparatus 100 according to the present embodiment described above has the same reference character and will not be described in detail. The same holds true for the light emitting apparatuses according to second to fourth variations of the present embodiment shown below.

In the light emitting apparatus 100 described above, the barrier layers 35 each include the low bandgap section 35a and the high bandgap section 35b, as shown in FIG. 2. The barrier layers 35 are each an AlGaN layer.

In contrast, in the light emitting apparatus 200, the barrier layer 35 does not include the low bandgap section 35a or the high bandgap section 35b, as shown in FIG. 5. The barrier layer 35 is, for example, a GaN layer.

In the light emitting apparatus 200, the current flowing at the side surfaces 31 of the columnar portions 30 can be reduced, as in the light emitting apparatus 100 described above.

Furthermore, in the light emitting apparatus 200, in which neither the low bandgap section 35a nor the high bandgap section 35b is formed in each of the barrier layers 35, which form the light emitting layer 34 having a complicated structure, the columnar portions 30 can be readily formed.

3.2. Second Variation

Figure 6:
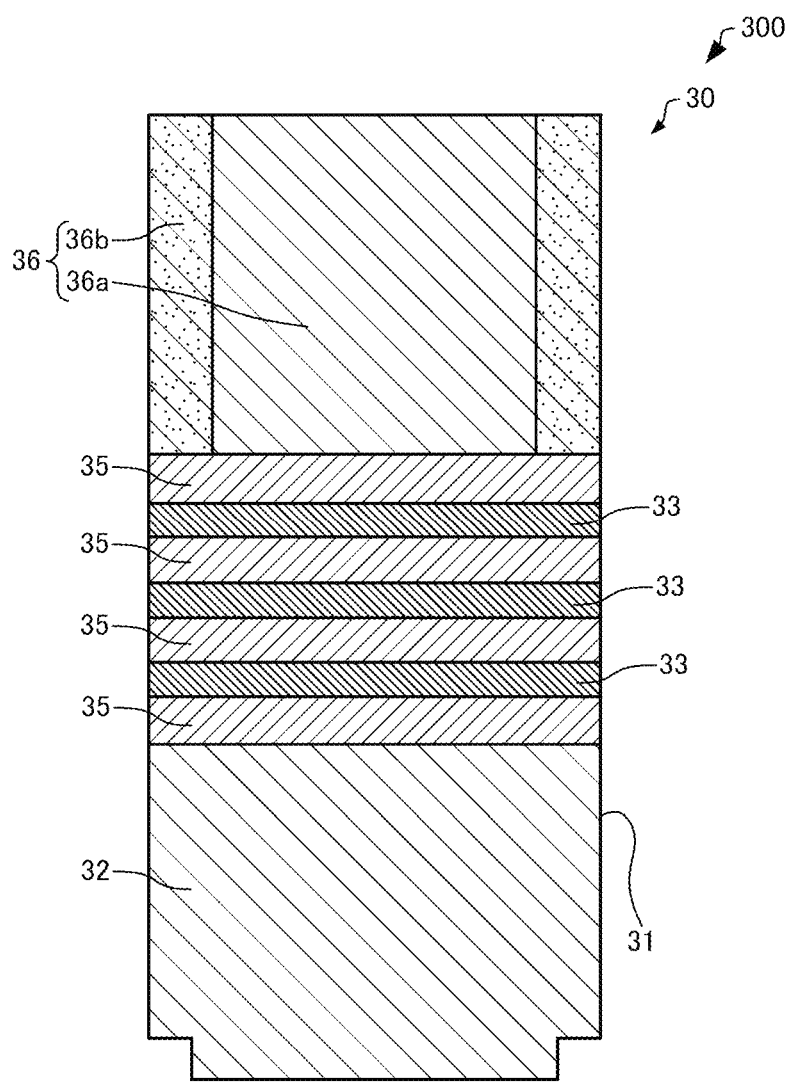
FIG. 6 is a cross-sectional view diagrammatically showing a columnar portion of the light emitting apparatus according to a second variation of the embodiment.

The light emitting apparatus according to a second variation of the present embodiment will next be described with reference to the drawings. FIG. 6 is a cross-sectional view diagrammatically showing one of the columnar portions 30 of a light emitting apparatus 300 according to the second variation of the present embodiment.

In the light emitting apparatus 100 described above, the first semiconductor layers 32 each include the low bandgap section 32a and the high bandgap section 32b, as shown in FIG. 2. Furthermore, the barrier layers 35 each include the low bandgap section 35a and the high bandgap section 35b. The first semiconductor layers 32 and the barrier layers 35 are each an AlGaN layer.

In contrast, in the light emitting apparatus 300, the first semiconductor layer 32 does not include the low bandgap section 32a or the high bandgap section 32b, as shown in FIG. 6. Furthermore, the barrier layer 35 does not include the low bandgap section 35a or the high bandgap section 35b. The first semiconductor layer 32 and the barrier layer 35 are each a GaN layer.

In the light emitting apparatus 300, the current flowing at the side surfaces 31 of the columnar portions 30 can be reduced, as in the light emitting apparatus 100 described above.

3.3. Third Variation

Figure 7:
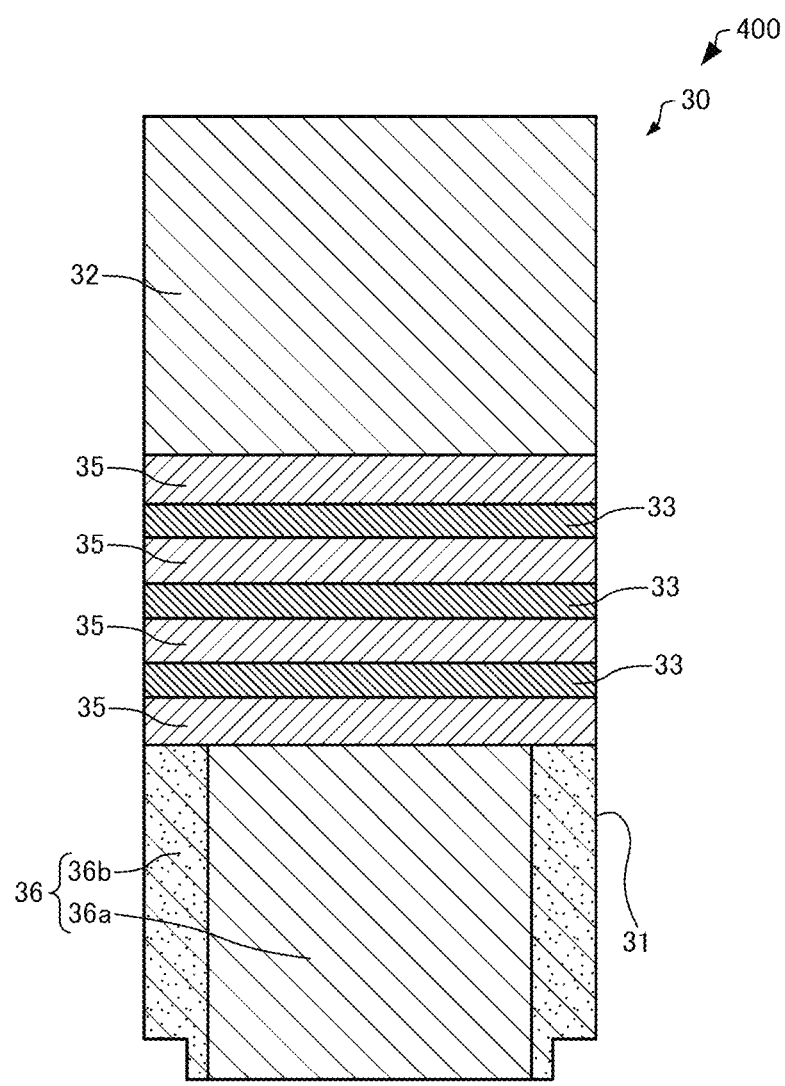
FIG. 7 is a cross-sectional view diagrammatically showing a columnar portion of the light emitting apparatus according to a third variation of the embodiment.

The light emitting apparatus according to a third variation of the present embodiment will next be described with reference to the drawings. FIG. 7 is a cross-sectional view diagrammatically showing one of the columnar portions 30 of a light emitting apparatus 400 according to the third variation of the present embodiment.

In the light emitting apparatus 100 described above, the first semiconductor layers 32 each include the low bandgap section 32a and the high bandgap section 32b, as shown in FIG. 2. Furthermore, the barrier layers 35 each include the low bandgap section 35a and the high bandgap section 35b. The first semiconductor layers 32 and the barrier layers 35 are each an AlGaN layer. Furthermore, the first semiconductor layers 32 are provided under the light emitting layers 34 and are each an n-type semiconductor layer. Moreover, the second semiconductor layers 36 are provided on the light emitting layers 34 and are each a p-type semiconductor layer.

In contrast, in the light emitting apparatus 400, the first semiconductor layer 32 does not include the low bandgap section 32a or the high bandgap section 32b, as shown in FIG. 7. Furthermore, the barrier layer 35 does not include the low bandgap section 35a or the high bandgap section 35b. The first semiconductor layer 32 and the barrier layer 35 are each a GaN layer.

The first semiconductor layer 32 is provided on the light emitting layer 34. The first semiconductor layer 32 is provided between the light emitting layer 34 and the second electrode 42. The first semiconductor layer 32 is a p-type semiconductor layer.

The second semiconductor layer 36 is provided below the light emitting layer 34. The second semiconductor layer 36 is provided on the buffer layer 22. The second semiconductor layer 36 is provided between the substrate 10 and the light emitting layer 34. The second semiconductor layer 36 is an n-type semiconductor layer.

In the light emitting apparatus 400, the current flowing at the side surfaces 31 of the columnar portions 30 can be reduced, as in the light emitting apparatus 100 described above.

In the light emitting apparatuses 300 and 400 described above, the barrier layers 35 may each be an AlGaN layer or may each include the low bandgap section 35a and the high bandgap section 35b.

3.4. Fourth Variation

The light emitting apparatus according to a fourth variation of the present embodiment will next be described.

In the light emitting apparatus 100 described above, the first semiconductor layers 32, the barrier layers 35, and the second semiconductor layers 36 are each an AlGaN layer.

In contrast, in the light emitting apparatus according to the fourth variation of the present embodiment, the first semiconductor layers 32, the barrier layers 35, and the second semiconductor layers 36 are each a BGaN layer containing B (boron), Ga, and N.

The atomic concentration of B in the high bandgap section 32b of each of the first semiconductor layers 32 is higher than that in the low bandgap section 32a. The atomic concentration of B in the high bandgap section 35b of each of the barrier layers 35 is higher than that in the low bandgap section 35a. The atomic concentration of B in the high bandgap section 36b of each of the second semiconductor layers 36 is higher than that in the low bandgap section 36a. In the columnar portions 30, B is unevenly distributed or concentrated at the side surfaces 31.

The high bandgap sections 32b, 35b, and 36b are portions where the atomic concentration of B is higher than that of Ga. In the high bandgap sections 32b, 35b, and 36b, the ratio of the atomic concentration of B to the sum of the atomic concentrations of B and Ga (hereinafter also referred to as "B ratio") is, for example, greater than 0.5 and may be greater than or equal to 0.8. Furthermore, the B ratio may be 1.0, in which case the high bandgap sections 32b, 35b, and 36b is made of BN.

The low bandgap sections 32a, 35a, and 36a are portions where the atomic concentration of B is lower than or equal to that of Ga. In the low bandgap sections 32a, 35a, and 36a, the B ratio is lower than or equal to 0.5 and may be lower than or equal to 0.4. The atomic concentration of B can be measured by STEM-EDS.

The epitaxial growth of the first semiconductor layers 32, the barrier layers 35, and the second semiconductor layers 36 is performed under the condition that B is unevenly distributed or concentrated at the side surfaces 31 of the columnar portions 30.

In the light emitting apparatus according to the fourth variation of the present embodiment, the current flowing at the side surfaces 31 of the columnar portions 30 can be reduced, as in the light emitting apparatus 100 described above.

4. Projector

Figure 8:
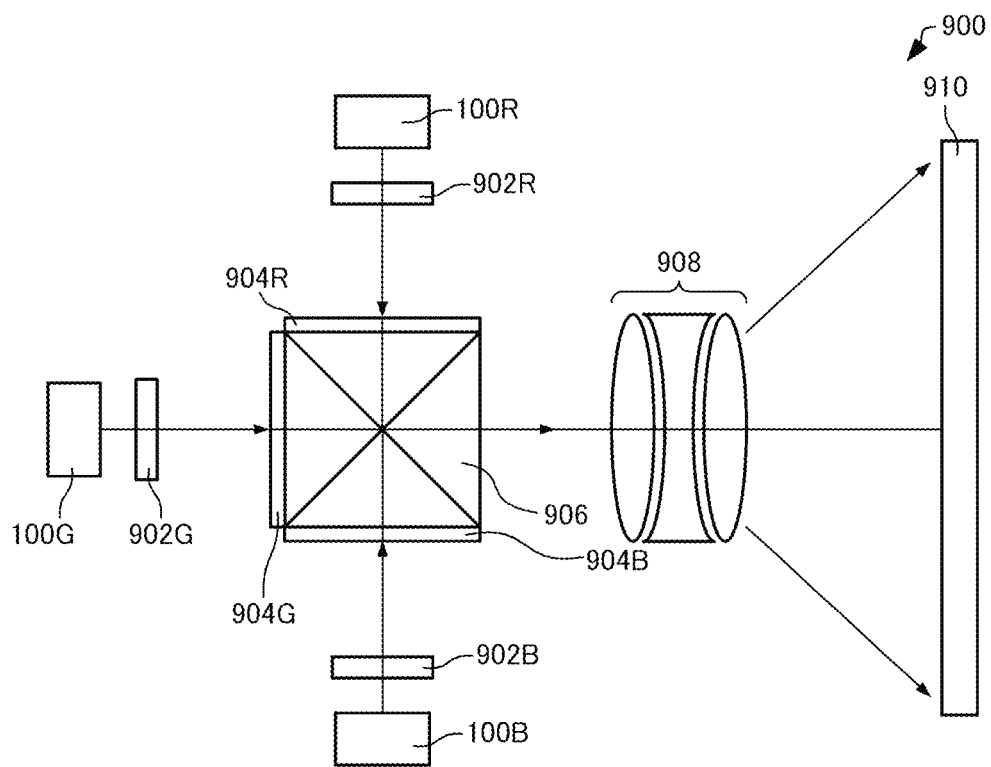
FIG. 8 diagrammatically shows a projector according to the embodiment.

A projector according to the present embodiment will next be described with reference to the drawings. FIG. 8 diagrammatically shows a projector 900 according to the present embodiment.

The projector 900 includes, for example, the light emitting apparatus 100 as a light source.

The projector 900 includes an enclosure that is not shown, and a red light source 100R, a green light source 100G, and a blue light source 100B, which are provided in the enclosure and output red light, green light, and blue light, respectively. In FIG. 8, the red light source 100R, the green light source 100G, and the blue light source 100B are simplified for convenience.

The projector 900 further includes a first optical element 902R, a second optical element 902G, a third optical element 902B, a first light modulator 904R, a second light modulator 904G, a third light modulator 904B, and a projection apparatus 908, which are provided in the enclosure. The first light modulator 904R, the second light modulator 904G, and the third light modulator 904B are each, for example, a transmissive liquid crystal light valve. The projection apparatus 908 is, for example, a projection lens.

The light outputted from the red light source 100R enters the first optical element 902R. The first optical element 902R collects the light outputted from the red light source 100R. The first optical element 902R may have another function in addition to the light collection function. The same holds true for the second optical element 902G and the third optical element 902B, which will be described later.

The light collected by the first optical element 902R is incident on the first light modulator 904R. The first light modulator 904R modulates the light incident thereon in accordance with image information. The projection apparatus 908 then enlarges an image formed by the first light modulator 904R and projects the enlarged image on a screen 910.

The light outputted from the green light source 100G enters the second optical element 902G. The second optical element 902G collects the light outputted from the green light source 100G.

The light collected by the second optical element 902G is incident on the second light modulator 904G. The second light modulator 904G modulates the light incident thereon in accordance with image information. The projection apparatus 908 then enlarges an image formed by the second light modulator 904G and projects the enlarged image on the screen 910.

The light outputted from the blue light source 100B enters the third optical element 902B. The third optical element 902B collects the light outputted from the blue light source 100B.

The light collected by the third optical element 902B is incident on the third light modulator 904B. The third light modulator 904B modulates the light incident thereon in accordance with image information. The projection apparatus 908 then enlarges an image formed by the third light modulator 904B and projects the enlarged image on the screen 910.

The projector 900 can further include a cross dichroic prism 906, which combines the light outputted from the first light modulator 904R, the light outputted from the second light modulator 904G, and the light outputted from the third light modulator 904B with one another and guides the combined light to the projection apparatus 908.

The red light modulated by the first light modulator 904R, the green light modulated by the second light modulator 904G, and the blue light modulated by the third light modulator 904B enter the cross dichroic prism 906. The cross dichroic prism 906 is formed by bonding four right-angled prisms to each other, and a dielectric multilayer film that reflects the red light and a dielectric multilayer film that reflects the blue light are disposed at the inner surfaces of the combined prisms. The dielectric multilayer films combine the red light, the green light, and the blue light with one another to form light representing a color image. The combined light is then projected by the projection apparatus 908 on the screen 910, whereby an enlarged image is displayed.

The red light source 100R, the green light source 100G, and the blue light source 100B may instead directly form images in a configuration in which none of the first light modulator 904R, the second light modulator 904G, and the third light modulator 904B is used but the light emitting apparatuses 100 corresponding to the light sources are controlled as the pixels of the images in accordance with the image information. The projection apparatus 908 may then enlarge the images formed by the red light source 100R, the green light source 100G, and the blue light source 100B and project the enlarged images on the screen 910.

In the example described above, transmissive liquid crystal light valves are used as the light modulators, and light valves based not on liquid crystal materials or reflective light valves may be used. Examples of such light valves may include reflective liquid crystal light valves and digital micromirror devices. The configuration of the projection apparatus is changed as appropriate in accordance with the type of the light valves used in the projector.

The present disclosure is also applicable to a light source apparatus of a scanning-type image display apparatus including a light source and a scanner that is an image formation apparatus that displays an image having a desired size on a display surface by scanning the screen with the light from the light source.

The light emitting apparatus according to the embodiment described above can be used in other applications in addition to a projector. Examples of the applications other than a projector may include an indoor or outdoor illuminator, a backlight of a display, a laser printer, a scanner, an in-vehicle light, a sensing instrument using light, and a light source of a communication instrument. The light emitting apparatus according to the embodiment described above can also be used as minute light emitters of an LED display including the light emitters arranged in an array to display images.

5. Experimental Example

An n-type GaN layer, an n-type AlGaN layer, and an n-type GaN layer were epitaxially grown in this order to produce columnar portions. The MBE method was used as the method for the epitaxial growth. The temperature at which the AlGaN layer was grown was set at 850° C.

Figure 9:
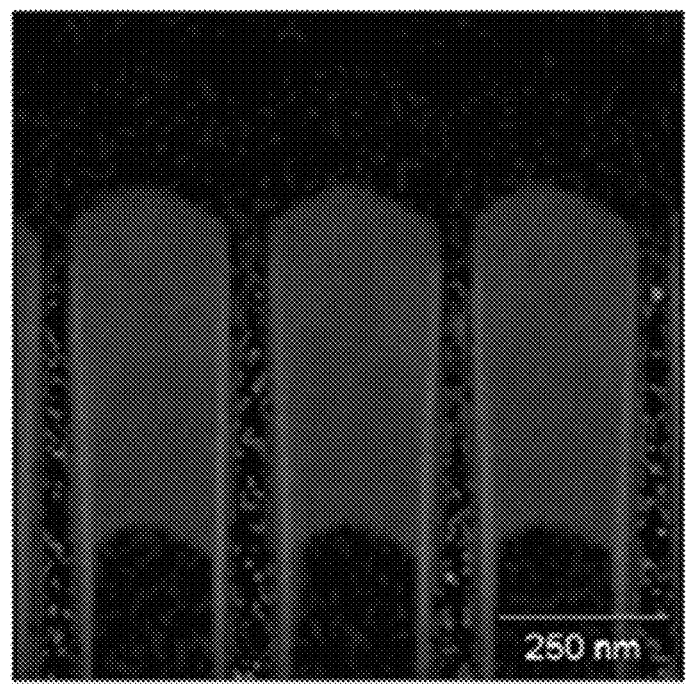
FIG. 9 is an STEM image in an experimental example.

The columnar portions produced as described above were observed under an STEM, and the distribution of Al was examined by EDS. FIG. 9 is an STEM image showing the distribution of Al in the columnar portions. In FIG. 9, an area where a smaller amount of Al is present is shown in a darker color, and an area where a larger amount of Al is present is shown in a lighter color.

FIG. 9 shows that the epitaxial growth of the AlGaN layer at the growth temperature of 850° C. allowed Al to be unevenly distributed or concentrated at the side surfaces of the columnar portions.

The embodiment and the variations described above are presented by way of example, and the present disclosure is not limited thereto. For example, the embodiment and the variations can be combined with each other as appropriate.

The present disclosure encompasses substantially the same configuration as the configuration described in the embodiment, for example, a configuration having the same function, using the same method, and providing the same result or a configuration having the same purpose and providing the same effect. Furthermore, the present disclosure encompasses a configuration in which an inessential portion of the configuration described in the embodiment is replaced. Moreover, the present disclosure encompasses a configuration that provides the same effects and advantages as those provided by the configuration described in the embodiment or a configuration that can achieve the same purpose as that achieved by the configuration described in the embodiment. Furthermore, the present disclosure encompasses a configuration in which a known technology is added to the configuration described in the embodiment.

The following contents are derived from the embodiment and variations described above.

A light emitting apparatus according to an aspect of the present disclosure includes a laminated structure including a plurality of columnar portions. The plurality of columnar portions each includes a first semiconductor layer, a second semiconductor layer different from the first semiconductor layer in terms of conductivity type, and a light emitting layer provided between the first semiconductor layer and the second semiconductor layer. The second semiconductor layer has a first section, and a second section that surrounds the first section in a plan view along a lamination direction in which the first semiconductor layer and the light emitting layer are laminated structured on each other and has a bandgap wider than a bandgap of the first section. The second section forms a side surface of each of the columnar portions.

In the light emitting apparatus, the current flowing at the side surfaces of the columnar portions can be reduced. The current resulting in non-light-emission recombination can thus be reduced. As a result, the current injection efficiency can be increased.

In the light emitting apparatus according to the aspect described above, the second semiconductor layer may be an AlGaN layer, and an atomic concentration of Al in the second section may be higher than an atomic concentration of Al in the first section.

In the light emitting apparatus described above, the bandgap of the second section can be readily made higher than the bandgap of the first section.

In the light emitting apparatus according to the aspect described above, the first semiconductor layer may have a third section, and a fourth section that surrounds the third section in the plan view along the lamination direction and has a bandgap wider than a bandgap of the third section. The fourth section may form the side surface of each of the columnar portions.

According to the light emitting apparatus described above, the current flowing at the side surfaces of the columnar portions can be further reduced.

In the light emitting apparatus according to the aspect described above, the first semiconductor layer may be an AlGaN layer, and an atomic concentration of Al in the fourth section may be higher than an atomic concentration of Al in the third section.

In the light emitting apparatus described above, the bandgap of the fourth section can be readily made higher than the bandgap of the third section.

In the light emitting apparatus according to the aspect described above, the light emitting layer may include a well layer and a barrier layer. The barrier layer may have a fifth section, and a sixth section that surrounds the fifth section in the plan view along the lamination direction and has a bandgap wider than a bandgap of the fifth section. The sixth section may form the side surface of each of the columnar portions.

According to the light emitting apparatus described above, the current flowing at the side surfaces of the columnar portions can be further reduced.

In the light emitting apparatus according to the aspect described above, the barrier layer may be an AlGaN layer, and an atomic concentration of Al in the sixth section may be higher than an atomic concentration of Al in the fifth section.

In the light emitting apparatus described above, the bandgap of the sixth section can be readily made higher than the bandgap of the fifth section.

A projector according to another aspect of the present disclosure includes the light emitting apparatus according to the aspect described above.

What is claimed is:

1. A light emitting apparatus comprising:
a laminated structure including a plurality of columnar portions,
wherein the plurality of columnar portions each includes
a first semiconductor layer,
a second semiconductor layer different from the first semiconductor layer in terms of conductivity type, and
a light emitting layer provided between the first semiconductor layer and the second semiconductor layer,
the second semiconductor layer has
a first section, and
a second section that surrounds the first section in a plan view along a lamination direction in which the first semiconductor layer and the light emitting layer are laminated structured on each other and has a bandgap wider than a bandgap of the first section, and
the second section forms a side surface of each of the columnar portions,
wherein the second semiconductor layer is an AlGaN layer, and
an atomic concentration of Al in the second section is higher than an atomic concentration of Al in the first section.

2. The light emitting apparatus according to claim 1,
wherein the first semiconductor layer has
a third section, and
a fourth section that surrounds the third section in the plan view along the lamination direction and has a bandgap wider than a bandgap of the third section, and
the fourth section forms the side surface of each of the columnar portions.

3. The light emitting apparatus according to claim 1,
wherein the light emitting layer includes a well layer and a barrier layer,
the barrier layer has
a fifth section, and
a sixth section that surrounds the fifth section in the plan view along the lamination direction and has a bandgap wider than a bandgap of the fifth section, and
the sixth section forms the side surface of each of the columnar portions.

4. A projector comprising the light emitting apparatus according to claim 1.

5. A light emitting apparatus comprising:
a laminated structure including a plurality of columnar portions,
wherein the plurality of columnar portions each includes
a first semiconductor layer,
a second semiconductor layer different from the first semiconductor layer in terms of conductivity type, and
a light emitting layer provided between the first semiconductor layer and the second semiconductor layer,
the second semiconductor layer has
a first section, and
a second section that surrounds the first section in a plan view along a lamination direction in which the first semiconductor layer and the light emitting layer are laminated structured on each other and has a bandgap wider than a bandgap of the first section, and
the second section forms a side surface of each of the columnar portions,
wherein the first semiconductor layer has
a third section, and
a fourth section that surrounds the third section in the plan view along the lamination direction and has a bandgap wider than a bandgap of the third section, and
the fourth section forms the side surface of each of the columnar portions,
wherein the first semiconductor layer is an AlGaN layer, and
an atomic concentration of Al in the fourth section is higher than an atomic concentration of Al in the third section.

6. A light emitting apparatus comprising:
a laminated structure including a plurality of columnar portions,
wherein the plurality of columnar portions each includes
a first semiconductor layer,
a second semiconductor layer different from the first semiconductor layer in terms of conductivity type, and a light emitting layer provided between the first semiconductor layer and the second semiconductor layer,
the second semiconductor layer has
a first section, and
a second section that surrounds the first section in a plan view along a lamination direction in which the first semiconductor layer and the light emitting layer are laminated structured on each other and has a bandgap wider than a bandgap of the first section, and
the second section forms a side surface of each of the columnar portions,
wherein the light emitting layer includes a well layer and a barrier layer,
the barrier layer has
a fifth section, and
a sixth section that surrounds the fifth section in the plan view along the lamination direction and has a bandgap wider than a bandgap of the fifth section, and
the sixth section forms the side surface of each of the columnar portions,
wherein the barrier layer is an AlGaN layer, and
an atomic concentration of Al in the sixth section is higher than an atomic concentration of Al in the fifth section.

* * * * *